(12) United States Patent
Yan et al.

(10) Patent No.: US 12,014,650 B2
(45) Date of Patent: Jun. 18, 2024

(54) METHOD OF REALIZING AN INTERACTIVE VIRTUAL EXPERIMENT BASED ON THE INTERNET

(71) Applicant: BEIJING GUOFA TIANYUAN INFORMATION TECHNOLOGY CO., LTD., Beijing (CN)

(72) Inventors: Jian Yan, Beijing (CN); Hao Ren, Beijing (CN)

(73) Assignee: BEIJING GUOFA TIANYUAN INFORMATION TECHNOLOGY CO., LTD., Beijing (CN)

( * ) Notice: Subject to any disclaimer, the term of this patent is extended or adjusted under 35 U.S.C. 154(b) by 209 days.

(21) Appl. No.: 17/371,573

(22) Filed: Jul. 9, 2021

(65) Prior Publication Data
US 2022/0013040 A1 Jan. 13, 2022

(30) Foreign Application Priority Data

Jul. 9, 2020 (CN) .......................... 202010666336.7

(51) Int. Cl.
*G09B 23/18* (2006.01)
*G05B 17/02* (2006.01)
(Continued)

(52) U.S. Cl.
CPC .......... *G09B 23/183* (2013.01); *G05B 17/02* (2013.01); *G06F 3/04842* (2013.01);
(Continued)

(58) Field of Classification Search
CPC ........ G09B 23/183; G09B 5/065; G09B 5/10; G05B 17/02
See application file for complete search history.

(56) References Cited

U.S. PATENT DOCUMENTS 5,261,041 A * 11/1993 Susman ................. G06T 13/00
345/643
5,813,865 A * 9/1998 Greenbowe ............ G09B 23/00
434/362
(Continued)

FOREIGN PATENT DOCUMENTS

CN 110032361 A * 7/2019

OTHER PUBLICATIONS

"Virtual Labs Introductory Video—PraxiLabs", 10 pages, uploaded on Dec. 2, 2019 by user "PraxiLabs". Retrieved from Internet: <http://www.youtube.com/watch?v=JB43YsUqYpl> (Year: 2019).*

*Primary Examiner* — Jay Trent Liddle
*Assistant Examiner* — Alyssa N Brandley
(74) *Attorney, Agent, or Firm* — TAROLLI, SUNDHEIM, COVELL & TUMMINO L.L.P.

(57) ABSTRACT

A method of realizing an interactive virtual experiment is provided. A teacher may drag a minimum experimental unit into a demonstration area using a mouse. The above operational action is described as digital data in a panoramic learning platform. The data is transmitted to a student client. The same minimum experimental unit is automatically placed in the same position of the demonstration area of the virtual experiment subsystem of the student client according to the data. The teacher may operate the minimum experimental unit. The operational action is described as digital data in the panoramic learning platform. The data is sent to the student client. The same operational action is automatically performed in the student client based on the above data. The demonstration is performed on the minimum experimental units in the demonstration areas of the teacher client and the student client.

2 Claims, 6 Drawing Sheets

(51) Int. Cl.
*G06F 3/04842* (2022.01)
*G06F 3/0486* (2013.01)
*G09B 5/06* (2006.01)
*G09B 5/10* (2006.01)

(52) U.S. Cl.
CPC ........... *G06F 3/0486* (2013.01); *G09B 5/065* (2013.01); *G09B 5/10* (2013.01)

(56) References Cited

U.S. PATENT DOCUMENTS

| | | | |
|---|---|---|---|
| 2003/0066026 A1* | 4/2003 | Jaffe | G06F 17/10 715/200 |
| 2005/0003330 A1* | 1/2005 | Asgarinejad | G09B 7/02 434/20 |
| 2013/0065216 A1* | 3/2013 | Mendoza Tascon | G06F 3/04847 434/362 |
| 2016/0300501 A1* | 10/2016 | Yan | G09B 5/06 |
| 2017/0140669 A1* | 5/2017 | Dey | G06F 1/1694 |
| 2018/0190030 A1* | 7/2018 | Wu | G09B 19/00 |
| 2018/0247550 A1* | 8/2018 | Lu | H04N 21/2143 |
| 2021/0349524 A1* | 11/2021 | Osadchiy | G06F 3/011 |

* cited by examiner

METHOD OF REALIZING AN INTERACTIVE VIRTUAL EXPERIMENT BASED ON THE INTERNET

RELATED APPLICATIONS

The present invention is a Nonprovisional Application under 35 USC 111(a), claiming priority to Serial No. CN 202010666336.7, filed on 9 Jul. 2020, the entirety of which is incorporated herein by reference.

TECHNICAL FIELD

The present invention relates to education informatization, in particular to a method of realizing an interactive virtual experiment based on the Internet. The method of realizing the virtual experiment can be widely used in informatization teaching, providing teachers and students with more intuitive, more convenient and more interactive virtual experiments and simulation methods.

BACKGROUND

With development of digital technology, more and more people learn new knowledge through the Internet, and online learning has become a brand new way for people to acquire knowledge. Especially, after the emergence of particularly serious public health events (such as SARS, COVID-19), the demand for and applications for online learning are continuously increasing all over the world. However, in the teaching process, when the teacher performs demonstration, interactive operations and other teaching steps with students, such as during object motion experiments, circuit experiments, optical experiments or the like in physics teaching or during various chemical reaction experiments in chemistry teaching, demonstrations in the online learning can be only performed through videos, and students cannot operate in person. Teachers are not able to know the students' problems during the operation so as to correct them quickly.

On the other hand, for some dangerous physical or chemical experiments, such as chemical experiments that can produce highly toxic substances, in order to ensure the safety of students, it is impossible to experience them in a real experimental environment. There are also some experiments in an ideal experimental environment, such as physics experiments in an ideal state of force, which can likewise only be shown to students by means of e.g., videos and animation simulations. With the development of education informatization technology and Internet technology, whether students can personally operate through new technologies by which experimental phenomena are demonstrated more intuitively has become a very prominent problem that needs to be solved urgently.

In order to solve the above technical problems, we need to achieve the following objectives:
 (1) To support simulation of various experimental tools and experimental instruments via computers.
 (2) To reproduce the response, effect, or movement in the real experiment.
 (3) To operate interactively. Through the network, an experimental unit on a client side can be operated by the students or teachers, and the operation can be synchronized to the interfaces of all other student clients or teacher clients who are watching online. At the same time, the feedback of each client should be consistent.

Most of the existing virtual simulation experimental systems are locally operated, and purchasing a software license is needed for each client, which greatly increases the costs of students using these systems. Therefore, how to implement virtual experiments and how to conduct remote interactive virtual experiments between teachers and students have become urgent problems to be solved in the prior art.

SUMMARY

In order to solve the above-mentioned problems in the prior art, the present invention provides a method of realizing a virtual experiment (or test) and a method of realizing an interactive virtual experiment based on the Internet.

The method of realizing the virtual experiment comprises the following steps:

Step 1, an experimental equipment is divided into minimum experimental units according to various experimental purposes.

For example, for a simple circuit experiment, the experimental equipment is divided into the minimum experimental units, including a battery, a battery box, a sliding rheostat, an ammeter, wires, a light bulb and a knife switch. For another example, for an experiment of heating potassium permanganate to produce oxygen, the experimental equipment is divided into a spirit lamp, a test tube, a single hole plug with catheter, a gas cylinder, a water tank, a test-tube rack, an iron stand and potassium permanganate chemical.

Step 2, a program attribute, a program logic and a program event are imparted to each of the minimum experimental units through a computer program.

The program attribute refers to a parameter and/or a state that the minimum experimental unit itself can provide to other minimum experimental units to use or for itself to output. For example, whether the spirit lamp is ignited, whether the bulb is in good condition, the voltage of the battery, and the resistance of the sliding rheostat are all program attributes.

The program logic refers to a logic processing flow of the current minimum experimental unit itself. For example, dragging the resistance block of the sliding rheostat will result in a change of its resistance value; clicking the knife switch can lead to switching of the state of the knife switch between closed and open; the test tube will be broken if it is heated in an empty state. The above all belongs to the program logic of the experimental unit itself.

The program event refers to a message generated by the current minimum experimental unit and sent to other minimum experimental units connected to or associated with the current minimum experimental unit. Each minimum experimental unit performs notifying through this way when there is a change in the program attribute. For example, when the test tube is heated, a heating event is generated for the test tube, which is transmitted to the experimental unit "chemical" contained in the test tube, so that a change happens in the program attribute of the chemical; when the resistance value of the sliding rheostat changes, other minimum experimental units in the same circuit will be notified through the program event. The program event has a certain transmission range and path. At the same time, the program event can also carry the change value or any other parameter of a generation object, to be used by the receiving minimum experimental unit.

Step 3, the minimum experimental unit receives the program event from another minimum experimental unit to trigger its own program logic.

Step 4, the minimum experimental unit that receives the program event can track the generation object of the program event, read an attribute or state value it can provide, and use a parameter carried by the received program event as an input parameter. Then the calculation is performed by its own program logic, and its own program attribute is changed according to the result of the calculation, so as to simulate a real experimental process or experimental phenomenon.

The method of realizing the virtual experiment will be demonstrated below through a specific experimental case.

1. Various independent experimental instruments (i.e. the minimum experimental units) are simulated through a computer program, and each minimum experimental unit corresponds to a real experimental instrument in reality. Such as a test tubes, a spirit lamp, a beaker, an ampoule, and a test-tube rack, etc. in chemical experiments; a voltmeter, an ammeter, a switch, a light bulb, and a rheostat, etc. in physical experiments. And, the computer program is written for each independent minimum experimental unit, so that it has the predetermined ability for judgment and logical operational action on its own, and triggers a corresponding operational result, which is displayed through animation and sound.

The spirit lamp, the match and the test tube in the chemical experiment are used to make a brief explanation:

As a minimum experimental unit, the spirit lamp has three basic states: open, closed, and ignited. The spirit lamp can only be turned into an ignited state when it is in an open state (the open state here means that the lamp cap of the spirit lamp is removed). To switch to the ignited state, a "match" unit must be used to approach the exposed wick for ignition. Among them, switching between the open and closed states of the spirit lamp is the operation to the spirit lamp cap. By removing the lamp cap through a mouse, a touch device or the like, the state of the spirit lamp experimental unit can be switched from the closed state to the open state. In the open state, when the match unit is close to the wick, the spirit lamp is ignited. When the lamp cap is covered back, the spirit lamp is switched from the ignited and open state to the extinguished and closed state.

When the spirit lamp is in the ignited state, a heating event can be automatically sent to an experimental unit (such as a test tube) close to its flame at a certain distance. And according to the distance between the experimental unit and the flame, the weight value of the heating amount is calculated to determine the heating intensity.

The above heating event can be received in the test tube experimental unit, and the parameter carried in the heating event is processed according to its own program logic, to change its own program attributes and transmit the program event of heating. If the test tube contains other minimum experimental units such as chemical, liquid, etc., the program event of heating can be received and processed by its corresponding program logic. If the test tube does not contain any other minimum experimental units such as chemical, liquid, etc., the degree of damage caused by empty burning is evaluated according to the logic of the test tube experimental unit itself, and the animation of the test tube bursting and the sound of the test tube bursting are played according to the calculation result to achieve the objective of simulating real experimental effect.

2. Specifically, specific programming should be performed according to the operation supported by each experimental unit. The operation made on the experimental unit by the user through the mouse or the touch screen is transformed into a operation signal that can be transmitted among the experimental units. At the same time, by means of the program logic processing ability of the experimental unit itself mentioned in the previous step (realized by the program attribute, the program logic and the program event of the minimum experimental unit), the operation signal is processed, calculation is made by also using other parameters, such as residence time, the distance to another minimum experimental unit, and various virtual environment parameters, etc., and then the calculation result is sent to other minimum experimental units associated with it in the form of the program event. The above process is repeated, and logical calculation is also performed, until a final result is generated.

The test tube and the test-tube rack are taken as examples to make a brief explanation. Both the test tube and the test-tube rack can support a moving event, that is, moving the experimental unit through the mouse or the touch screen and securing the placement position. In addition, the test tube and the test-tube rack can be associated. For example, dragging the test tube and placing it near the test-tube rack will cause a rippling effect, that is, the test tube is shown to be placed on the test-tube rack. At this point the test-tube rack is moved and the test tube will move accordingly, so that the operation in the real experiment is simulated. The battery and the battery box have similar effects.

A method of realizing an interactive virtual experiment based on a panoramic learning platform is provided. The panoramic learning platform comprises a teacher client and a student client. Both the teacher client and the student client comprise a virtual experiment subsystem. In the virtual experiment subsystem, the required minimum experimental units can be arranged according to the purpose of the experiment, and a demonstration area is provided. The method of realizing the virtual experiment adopts the aforementioned method, and the method of realizing the interactive virtual experiment comprises the following steps:

Step 1, a teacher drags each minimum experimental unit into a demonstration area using a way of a mouse, a touch device or the like.

Step 2, the above operation is described as digital data in the panoramic learning platform, and sent to a student client in the form of a data packet through the network. According to the data, a same minimum experimental unit is automatically placed in the same position of the demonstration area of the virtual experiment subsystem of the student client. The minimum experimental units in the demonstration areas of the student client and the teacher client have the same program attribute, program logic and program event.

Step 3, the teacher operates the minimum experimental unit according to experimental requirements. The operational action is described as digital data in the panoramic learning platform, and sent to the student client through the network in the form of a data packet. The same operation is automatically performed in the student client based on the above data.

Step 4, the demonstration of the simulation experiment is performed on the minimum experimental units in the demonstration areas at the teacher client and the student client according to the program attribute, the program logic and the program event.

The student client can also conduct experiment operations or operate a single step in the experiment according to the processes of steps 1 to 4 to realize the synchronous interactive operation of the experiment with the teacher client and other student clients.

By means of this kind of remote operation control based on network transmission, the moving coordinate points of the minimum experimental unit and the operational action (such as dragging, association, or the like) to the experimental unit can be transmitted, and a corresponding operation can be conducted to the corresponding minimum experimental unit on the current screen according to the data received from the network. This ensures that on different terminals, the parameters such as the location, association relationship, and operation steps of each experimental unit are completely consistent. Therefore, the minimum experimental unit described in the method of realizing the virtual experiment can not only accept a direct operation control from the local physical equipment (such as the mouse, the touch screen), but also can accept a remote operation control transmitted through the network and trigger its own program logic like the local direct operation control. Therefore, the interactive operation of multiple people participating in one experiment can be realized.

From the above description of the steps, it can be seen that the virtual experiment system needs to cover almost all the experimental instruments that need to be used in the current teaching process. For such a huge amount of data, a reasonable retrieval mode is inevitably required. We provide teachers and students with technical support for rapid retrieval by means of subject plus teaching content. An experiment selection interface is provided through the computer program. The operator may choose the experimental unit as per requirement, drag it to the demonstration area, and conduct the corresponding virtual experiment process demonstration.

The following beneficial technical effects can be achieved by the present invention:

1. By the virtual experiment, the consumption of the experimental equipment and the purchase cost of the experimental equipment can be greatly saved, the demonstration can be repeated, and the operational requirements are basically consistent with the real experiment.

2. The minimum experimental unit is imparted with the program attribute, the program logic and the program event through the computer programs, so that the minimum experimental unit has the greatest versatility. Students can not only use the system to directly call the experimental unit of a standard experiment, but also can set an experimental purpose, design experimental steps and experimental methods as per requirement.

3. Students and teachers can independently operate the virtual experiment on their respective clients, which solves the problem that students may only watch but not operate the physical or chemical experiments in the remote teaching. It can also be operated separately by the teachers and the students for different steps of the same experiment, so that the students are proficient in the key steps of the experiment, and it is also convenient for the teacher to make assessments on the operation conducted by the students.

DETAILED DESCRIPTION

In order to maximize the free combination of experimental equipment and reduce limitation on functions caused by the programming work, the design idea of "chain transmitting of events, independent implementation of logics" is adopted. By way of example, when realizing a simple experiment of heating a test tube and causing redox reaction of the chemicals in the test tube, we will divide the experimental equipment into minimum experimental units, that is, a test tube, chemicals, and a spirit lamp.

As one of the minimum experimental units, the spirit lamp has its own program attribute (the lamp cap opened and fire extinguished, the lamp cap closed and fire extinguished, ignited, the flame position), program logic (when the lamp cap is in an open state, switching to the ignited state when a burning match is close to the wick; when in the ignited state the lamp cap is dragged close to the top of the flame and released, switching back to the state that the lamp cap is capped and in the extinguished state), program event (in the ignited state, a heating event is generated). Herein, according to the program attribute and the program logic, the visual form of the spirit lamp is determined. The program event is an important communication way for association among the minimum experimental units and jointly operating to produce results.

When the spirit lamp is in the ignited state, heating events are continuously generated according to its own program logic. At the same time, according to a specific condition (for example, another experimental unit is in a certain range of the flame), the program event can be transmitted. If the test tube meets this condition, it can receive the program event of the spirit lamp—heating, and at the same time track the generation object of the event, read the attribute or state value it can provide, and then perform calculation by its own program logic. For example, it is judged whether to heat the bottom or the wall of the test tube according to the flame position of the spirit lamp and its own position; the heating intensity is evaluated according to the heating position and flame position (heating by use of outer flame, heating by use of inner flame, or too far away, etc.). This has an impact on its own state or attribute (for example, heating the wall of the test tube results in the test tube entering into a broken state, cannot be used), and at the same time, transferring the heating event to the chemicals inside the test tube in the same way. While, the chemicals also serve as the minimum experimental units with the same structure (the same structure here refers to having the program attribute, program logic, and program event), and perform the same processing flow as described above. According to the received heating event, after running its own program logic, a "producing gas" event is issued. In other experiments, the "producing gas" event can also be received and processed by other minimum experimental units.

Figure 1:
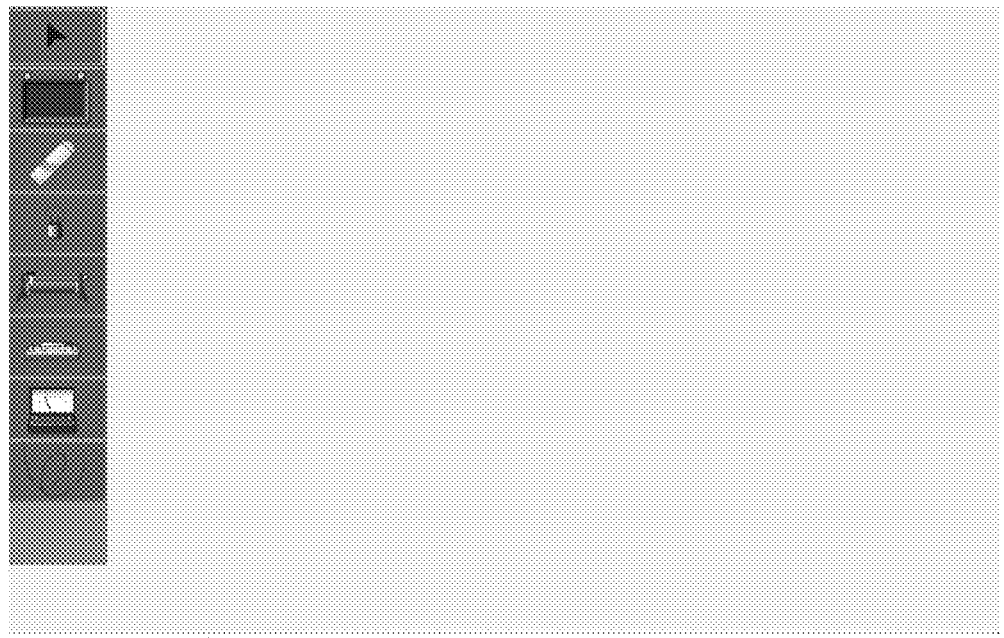
FIGS. 1 to 7 are diagrams showing demonstration steps of a method of realizing a virtual experiment.

In order to explain the program attribute, program logic, and program event of the experimental units more clearly, a simple physical circuit experiment is described in detail below. As shown in FIG. 1, users are provided with a battery box, a battery, a light bulb, a sliding rheostat, a knife switch, an ammeter, wires and other equipment. Each equipment is the minimum experimental unit with the program attribute or state, the program logic, and the program event as described above. A simple circuit experiment, in which the battery, the wires, the light bulb, and the knife switch form a closed circuit, is selected to illustrate.

First, we will introduce the minimum experimental units used and their own various logic functions.

As an experimental unit, the battery has a program attribute (voltage); a program logic (can be dragged, can be automatically associated with an approaching battery box, and can be automatically placed in the battery box); and a program event (generating current).

As an experimental unit, the light bulb has a program attribute or state (on, off, damaged); a program logic (can be dragged, can be connected with the wires, can be used to judge the current intensity, and consuming the current); and a program event (transmitting the received current event so as to simulate current conveyance).

As an experimental unit, the knife switch has a program attribute or state (open, and closed); a program logic (can be dragged, and can be connected with wires); and a program event (transmitting the received current event so as to simulate current conveyance).

As an experimental unit, the battery box has a program attribute or state (with or without any battery); a program logic (can be dragged, can be connected with the wires, can be used to calculate a voltage based on the battery storage, can be used to automatically receive the battery close to a specific area into the battery box, can be used to judge whether a complete loop is formed); and a program event (generating current).

As an experimental unit, the wire has a program attribute or state (with current, without current); a program logic (drawing lines according to the operating position of the mouse, recording the start and end positions of the drawing, and setting the link or connection state of the corresponding equipment according to the start and end positions); and a program event (transferring the received current event so as to simulate current conveyance).

Figure 2:
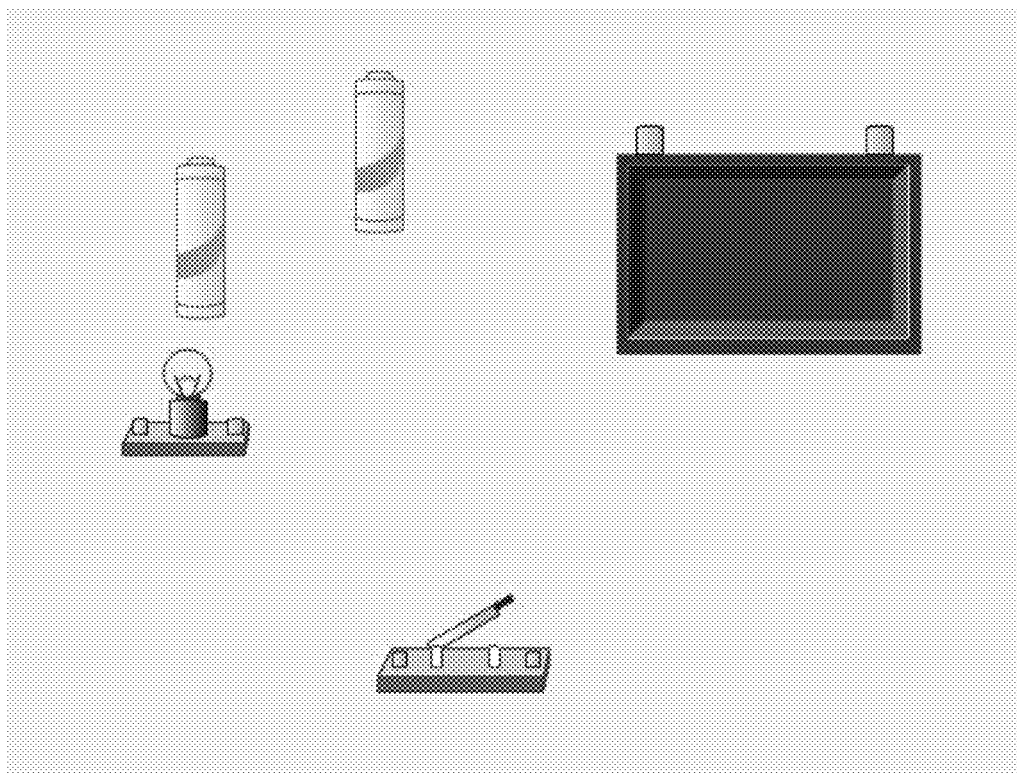

When an icon for the light bulb is clicked, a light bulb in the off state will be added to the demonstration area on the right side. Since no current event is received, the light bulb will not be switched to the on state. Similarly, icons for the battery, the battery box, and the knife switch are clicked to add corresponding experimental units to the demonstration area, making the experimental environment as shown in FIG. 2. The operator can drag the experimental units to move them so as to adjust their positions in the demonstration area.

Figure 3:
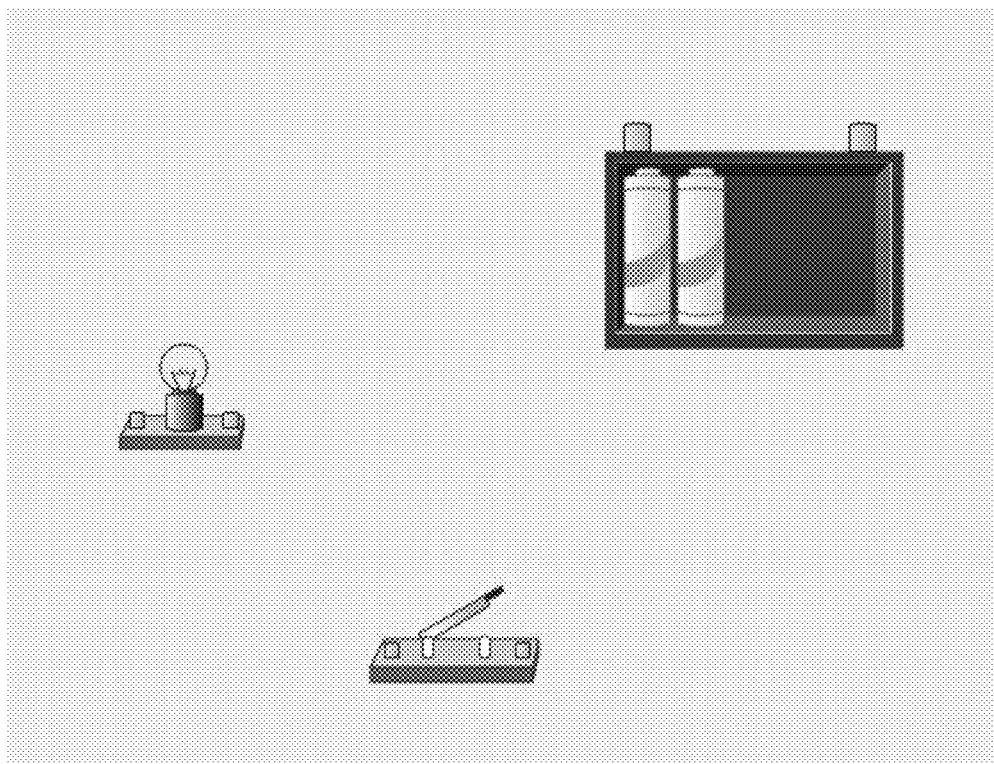

As shown in FIG. 2, since each experimental unit is currently independent of each other, any experimental unit will not change in its state. Next, since the battery has the logic of "can be dragged", the battery can be dragged into the battery box and then released. Since the battery box has the program logic of "receive the battery", the battery will be automatically received in the battery box. At the same time, the state of the battery box changes to "with battery". However, due to the program logic of the battery box, it is detected that a complete loop is not formed, therefore no current event will be generated. In the same way, two batteries are put into the battery box. The experimental scene is as shown in FIG. 3.

Figure 4:
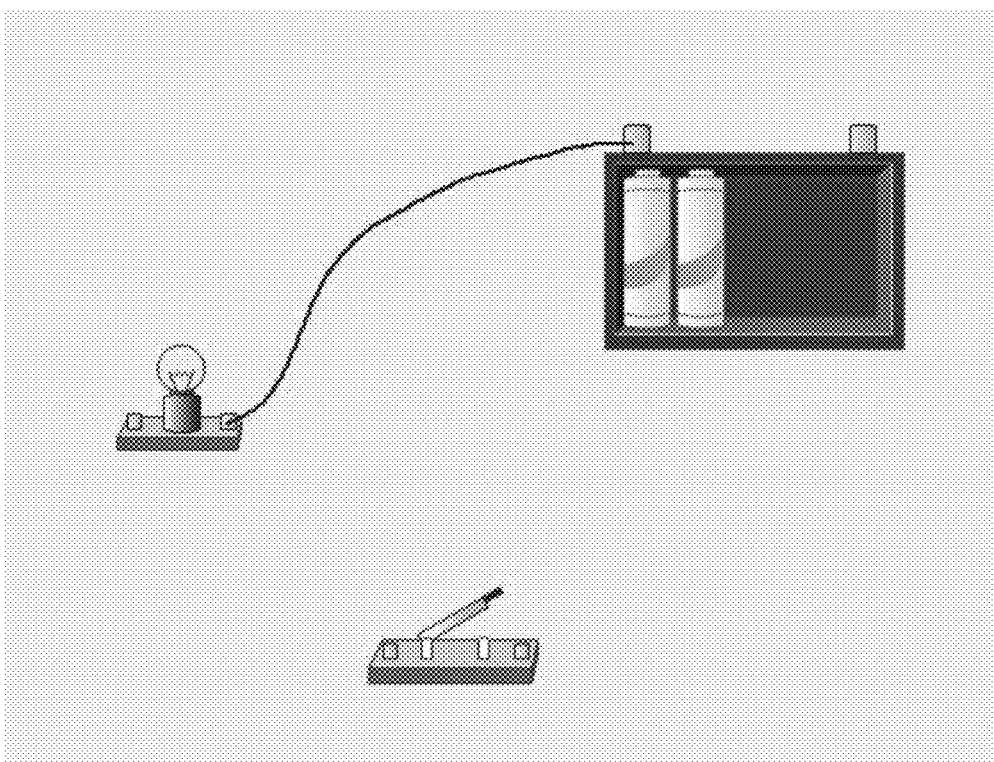

Next, the icon for the wire is clicked and the wire is dragged by the mouse to connect from a connection point of the light bulb to a connection point of the battery box, as shown in FIG. 4.

Figure 5:
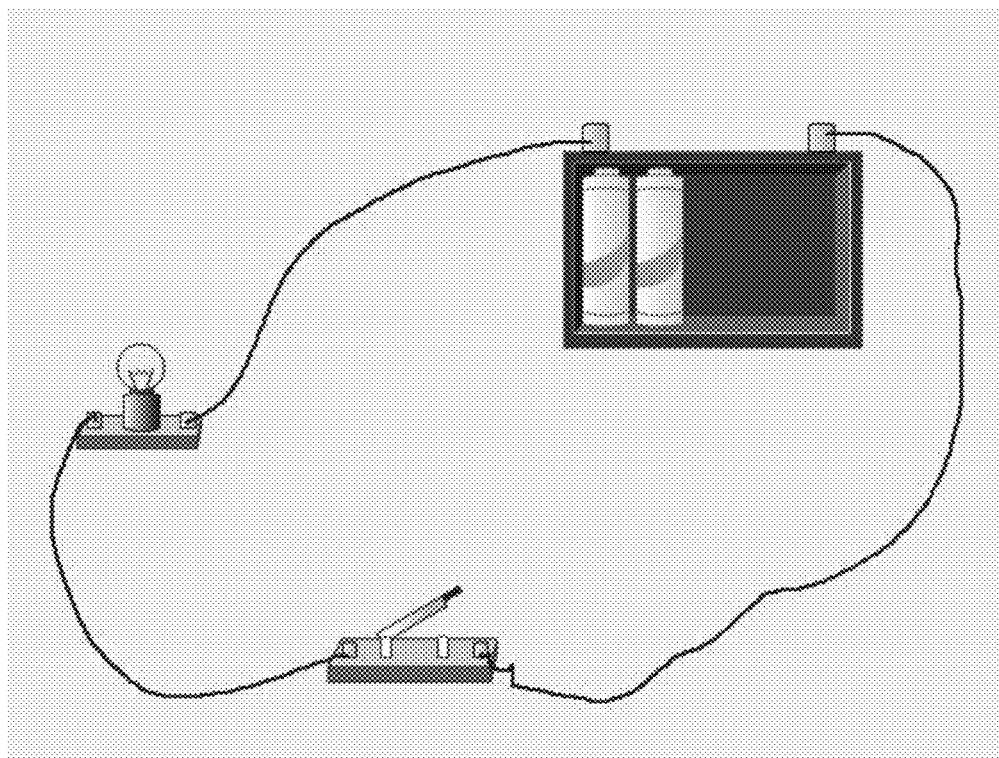

In this way, according to the line drawing logic of the wire, a wire can be drawn from the connection point of the light bulb to the connection point of the battery box. At the same time, according to the wire experiment unit's own program logic, the connection state of the light bulb and the battery box will be modified to be connected with each other. In the same way, it continues to connect the battery box and the knife switch, the switch and the light bulb. The experimental scene is as shown in FIG. 5.

Figure 6:
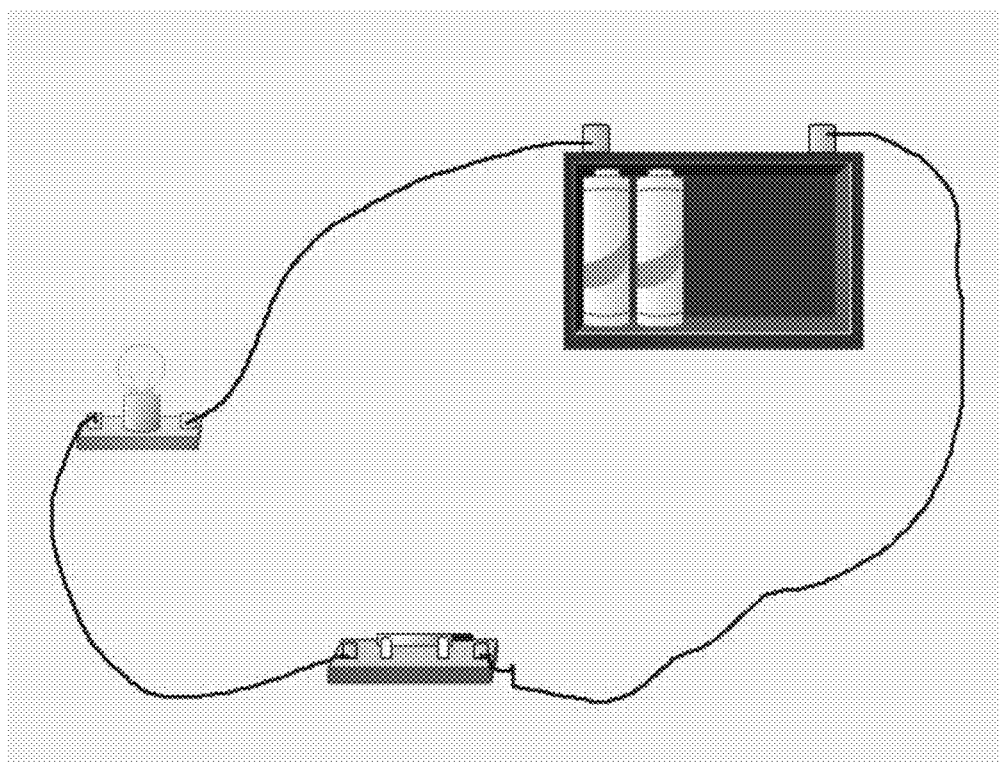
Figure 7:
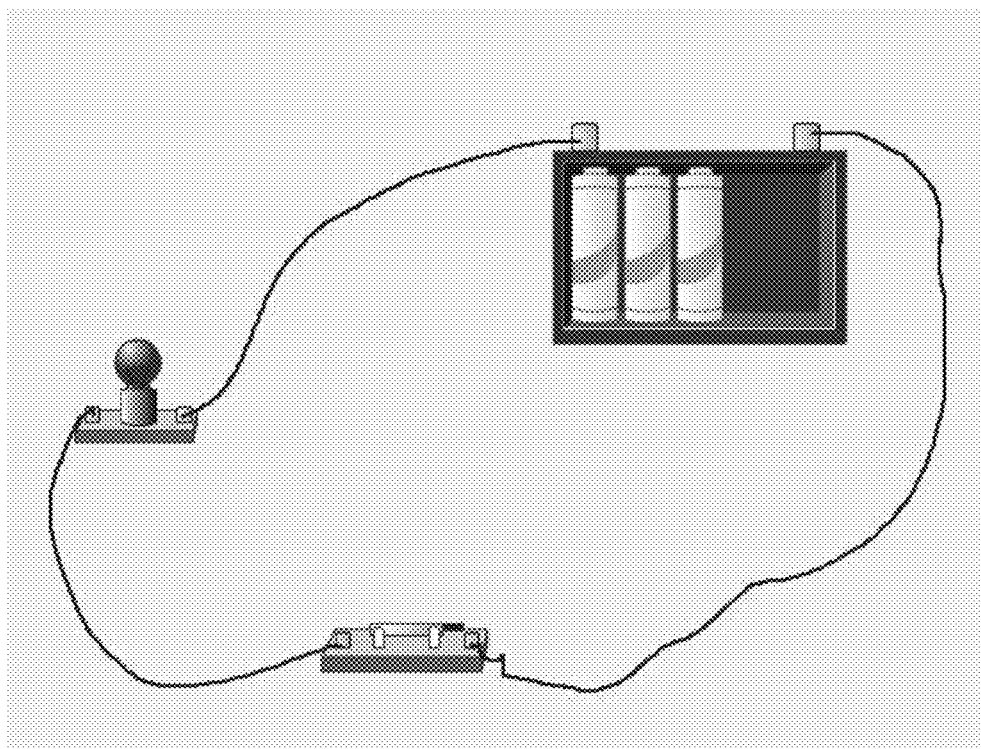

According to the logic of the wire, the connection states of the experimental units in the scene are: the battery box is connected to the knife switch, the knife switch is connected to the light bulb, and the light bulb is connected to the battery box, thereby a complete loop is formed, and the battery box continuously generates the current event. Now the current event can reach the switch smoothly according to the connection states. While the knife switch is in a state of the raised knife, the transmission of the program event is terminated by its own logic of the knife switch. When the knife switch is clicked to switch to the closed state, the switch starts to forward the current conveyance event, and transmit the event to the light bulb according to its own connection object. After the light bulb receives the current event, it switches to the lighting state according to its own logic (FIG. 6), and determines the lighting intensity based on the voltage and other parameters carried by the program event. If the voltage parameter exceeds its setting range, for example, adding an additional battery to make the battery box generate a higher voltage, it will even cause the bulb to be damaged (FIG. 7).

A method of realizing an interactive virtual experiment using a panoramic learning platform will be described in detail below. The panoramic learning platform includes a teacher client and a student client. Both the teacher client and the student client include a virtual experiment subsystem which is arranged with the minimum experimental units according to the purpose of the experiment and in which a demonstration area is provided.

Each minimum experimental unit is written by a computer program, and its content is completely the same whether at the teacher client or at the student client, and has the structure having a program attribute, a program logic and a program event, which is explained through an experimental procedure below.

Figure 8:
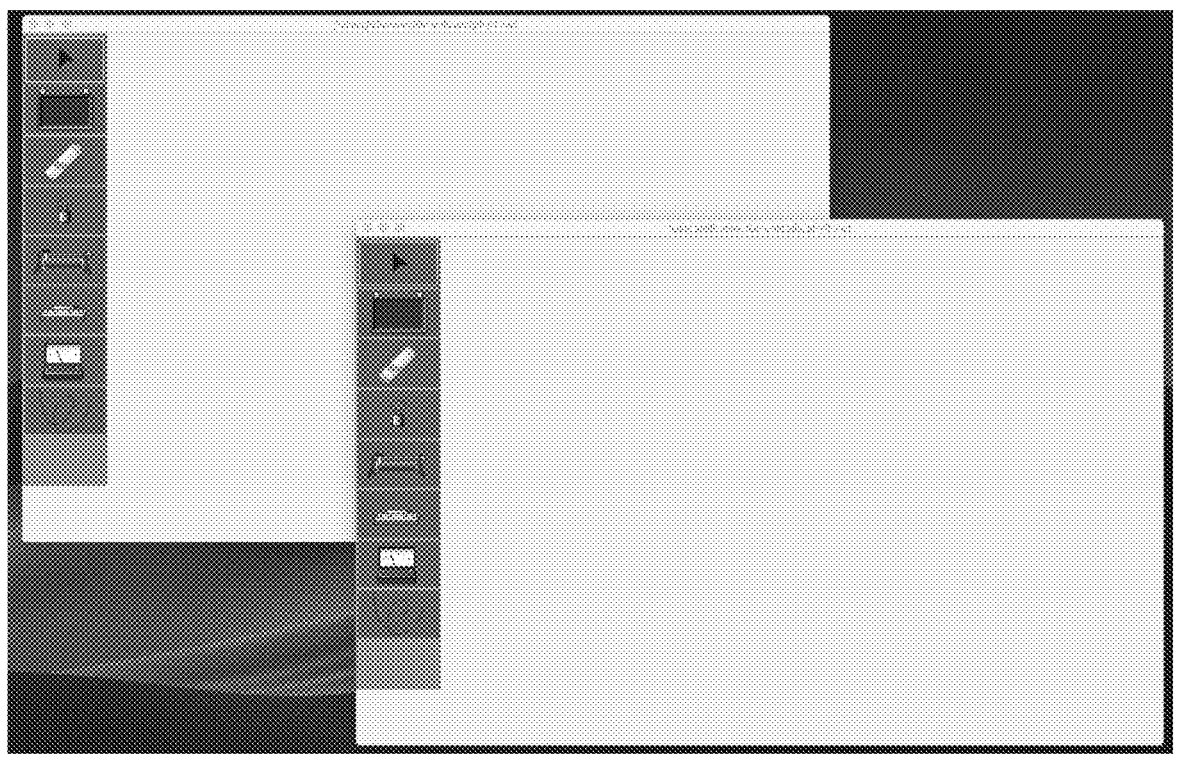
FIGS. 8-12 are diagrams showing demonstration steps of a method of realizing an interactive virtual experiment based on a panoramic learning platform.
Figure 9:
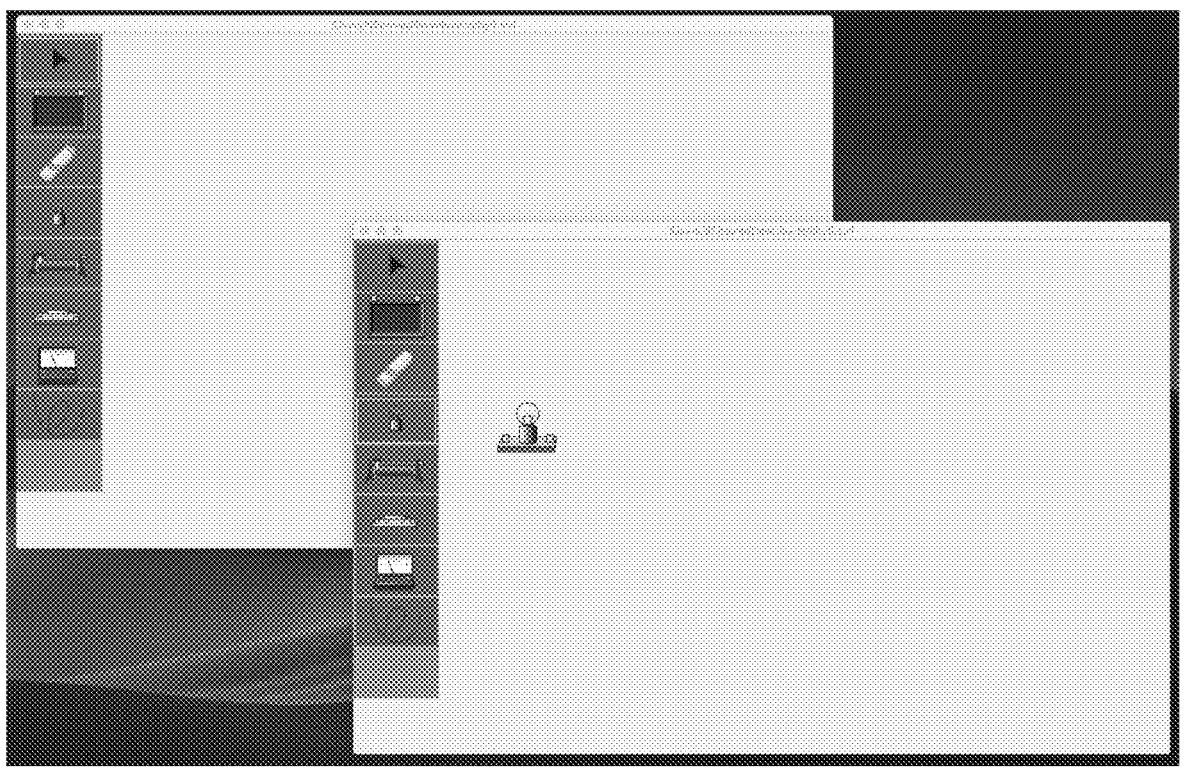
Figure 10:
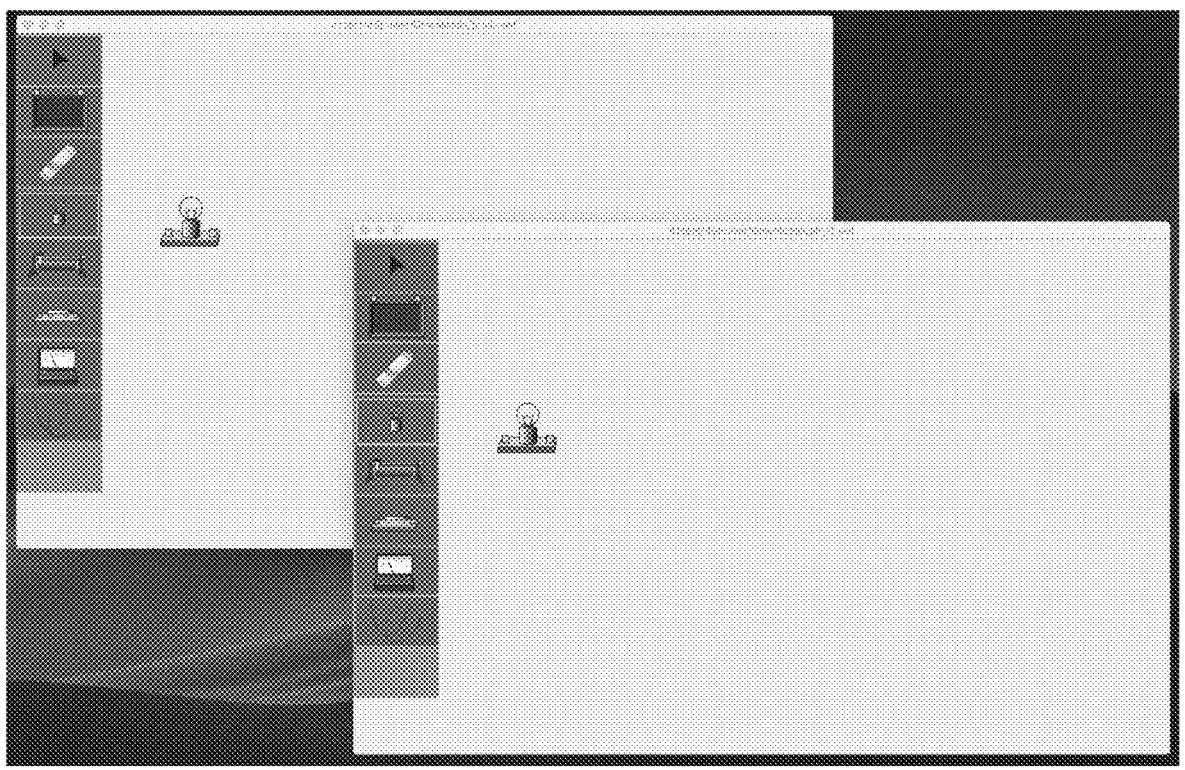

As shown in FIG. 8, two windows are shown for the teacher client and the student client respectively. If a light bulb is dragged into the student client, the action can be described as digital data in the panoramic learning platform of the student client to form a data packet. Then the data packet is sent to the teacher client through the network to inform the teacher client and other student clients that the light bulb is placed on the screen at this time, and what the location coordinates are (the type of the experimental unit and the coordinates of the experimental unit are sent). Then, in the teacher client and other student clients, the same experimental unit is automatically placed at the same location based on these data. This ensures that each client is the same as the student client originally operated, and the minimum experimental units of the teacher client and the student clients have the same structure of the program attribute, the program logic and the program event, as shown in FIG. 9 and FIG. 10.

Figure 11:
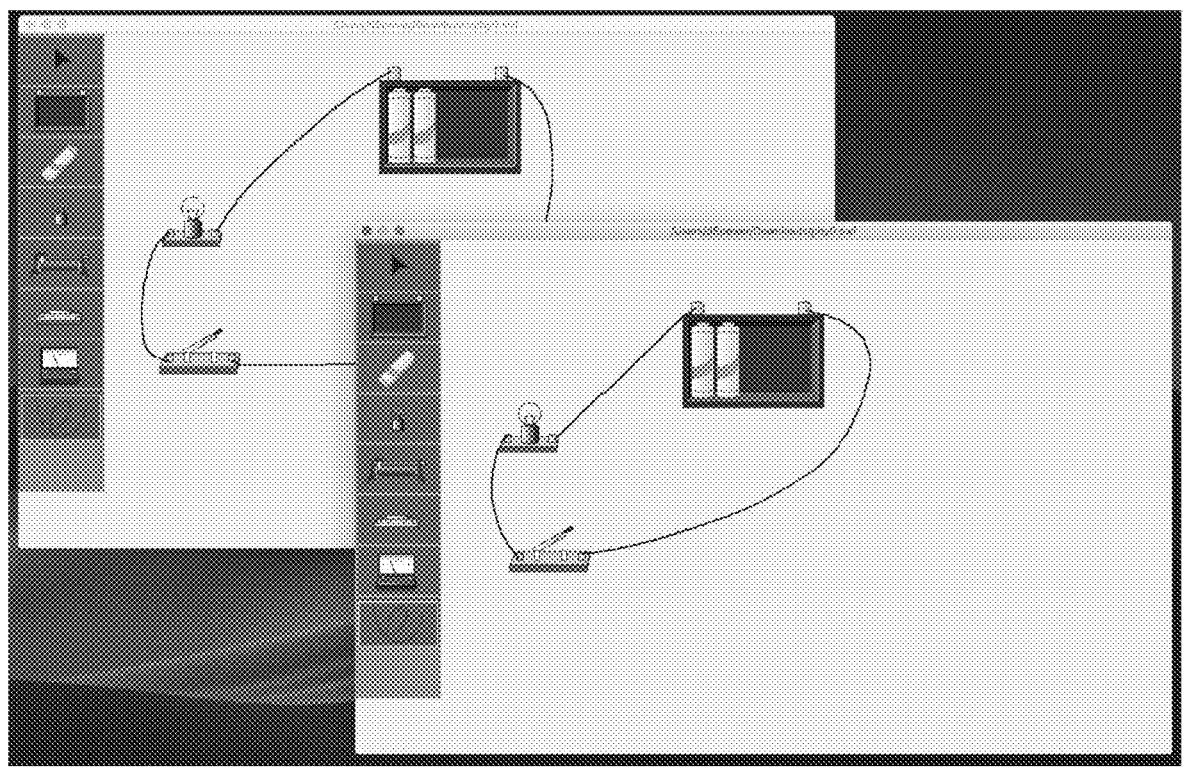
Figure 12:
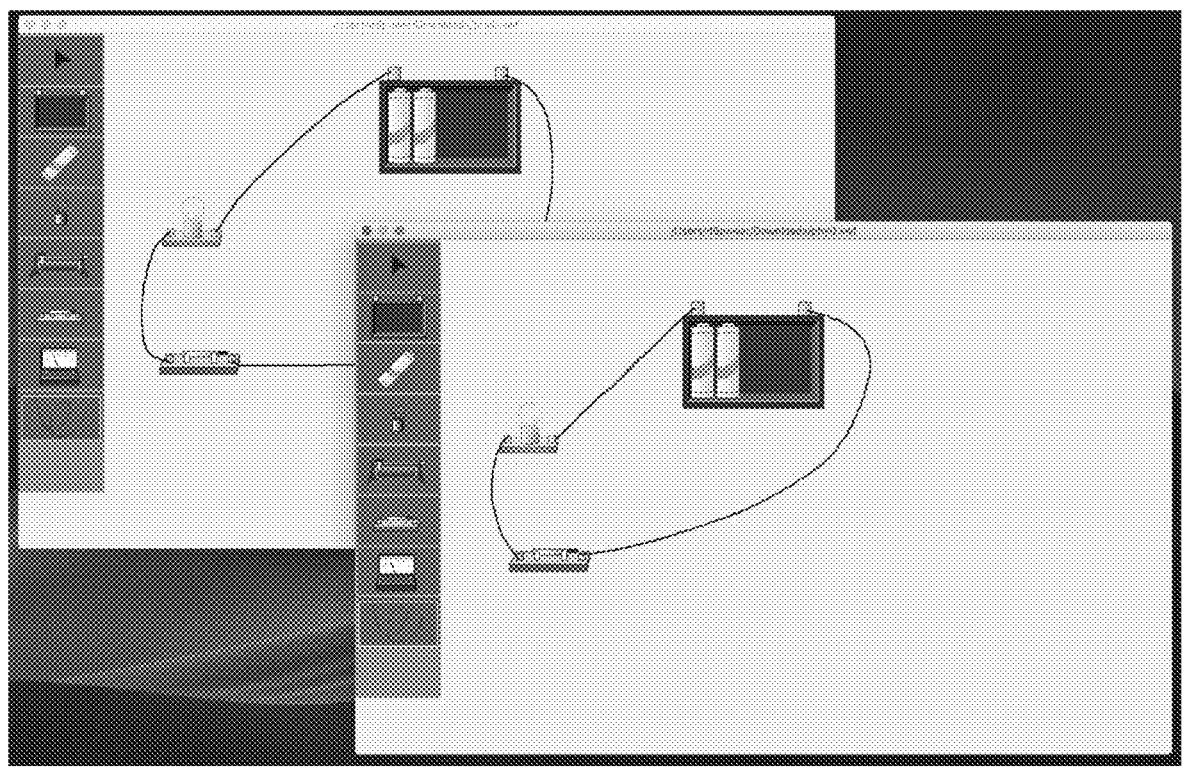

In the same way, the addition operations of other minimum experimental units can be performed. For example, the circuit as shown in FIG. 11 is constituted. At this time, if the knife switch is closed at the student client, the action is described as digital data in the panoramic learning platform so as to generate a data packet to send a notification to the teacher client. The carried data are the experimental unit number and the operational action—closing the switch. Once receiving the data packet, the teacher client will close the corresponding knife switch through the program instead of manual control. Since the components and connections on both screens are controlled by the above steps, it can be ensured that the components, connection sequences, and operational actions on the screens are completely consistent. At this time, when the program state of one of the experimental units changes, the same program event will be generated, and will be notified in the same order at each client to the other experimental units connected to it, so that each experimental unit runs by itself according to its own logic. That is, the battery provides the current, the knife switch allows the current to pass, and the light bulb detects that there is a current conveyance, so a lighting animation is automatically played, as shown in FIG. 12.

Through the network, the student or teacher can individually or jointly operate the experimental units on the clients, the effect of the experiment is basically the same as that of the real experiment, which can greatly save instruction cost and have a broad application space in the fields such as education informationization.

What is claimed is:

1. A method of realizing a virtual experiment comprising the following steps:
   dividing an experimental equipment into minimum experimental units according to various experimental purposes;
   imparting a program attribute, a program logic and a program event to each of the minimum experimental units through a computer program, so that each of the minimum experimental units independently has a predetermined ability for judgement and logical operational action on its own, and triggers a corresponding operational result;
   receiving, by a minimum experimental unit, the program event from another minimum experimental unit to trigger its own program logic; and
   identifying, by the minimum experimental unit that receives the program event, a generation object according to the program event, reading an attribute or state value that it can provide, using a parameter carried by the received program event as an input parameter, performing calculation by its own program logic, and changing its own program attribute or state according to the calculation result, so as to simulate a real experimental process or experimental phenomenon,
   wherein the program attribute refers to a parameter and a state that the minimum experimental unit itself can provide to other minimum experimental units to use or for itself to output, the program logic refers to a logic processing flow of the minimum experimental unit itself, and the program event refers to a message generated by the minimum experimental unit and sent to the minimum experimental units that meet a condition, by which a notice is given when there is a change in the program attribute,
   wherein the program event is transmitted in a chain among the minimum experimental units, based on the program logic being implemented by each of the minimum experimental units independently, and
   wherein specific programming is performed according to an operation supported by each of the minimum experimental units, so that an operation made on each of the minimum experimental units, by the user, is transformed into an operation signal that can be transmitted among the minimum experimental units, by the program logic of each of the minimum experimental units realized by the program attribute, the program logic, and the program event of the minimum experimental unit, wherein the operation signal is processed, and
   wherein calculation is made by using-parameters other than the operation signal, wherein the calculation result is then sent to other minimum experimental units associated with the calculation result in the form of the program event, and wherein the above process is repeated and-the calculation is performed in the other minimum experimental units until a final result of the virtual experiment is generated.

2. A method of realizing an interactive virtual experiment based on a panoramic learning platform, wherein the panoramic learning platform comprises a teacher client and a student client, both the teacher client and the student client comprise a virtual experiment subsystem which is arranged with minimum experimental units according to an experiment purpose and in which a demonstration area is provided, wherein the virtual experiment is realized by the method according to claim 1, the method of realizing the interactive virtual experiment comprising the following steps:
   (a) dragging, by a teacher, each minimum experimental unit into the demonstration area using a way of a mouse or a touch device;
   (b) describing the above operation as digital data in the panoramic learning platform, sending the data to the student client in the form of a data packet through a network, and automatically placing the same minimum experimental unit in the same position of the demonstration area of the virtual experiment subsystem of the student client according to the data, wherein the minimum experimental units in the demonstration areas of the teacher client and the student client have the same program attributes, program logic and program events;
   (c) operating, by the teacher, the minimum experimental unit according to experimental requirements, describing the operational action as digital data in the panoramic learning platform, sending the data to the student client through the network in the form of a data packet, and automatically performing, by the student client, the same operation based on said data; and
   (d) performing, on the minimum experimental units in the demonstration areas of the teacher client and the student client, the demonstrations of the simulation experiment according to the program attributes, program logic and program events;
   wherein experiment operations are conducted or a single step in the experiment is operated in the student client according to the process of steps (a) through (d) so as to realize a synchronous interactive operation of the experiment with the teacher client and other student clients.

* * * * *